(12) United States Patent
Chyi et al.

(10) Patent No.: US 9,076,650 B2
(45) Date of Patent: Jul. 7, 2015

(54) METHOD FOR FABRICATING MESA SIDEWALL WITH SPIN COATED DIELECTRIC MATERIAL AND SEMICONDUCTOR ELEMENT THEREOF

(71) Applicant: National Central University, Jhongli, Taoyuan County (TW)

(72) Inventors: Jen-Inn Chyi, Jhongli (TW); Sheng-Yu Wang, Jhongli (TW); Jiun-Ming Chen, Jhongli (TW)

(73) Assignee: NATIONAL CENTRAL UNIVERSITY, Jhongli, Taoyuan County (TW)

( * ) Notice: Subject to any disclaimer, the term of this patent is extended or adjusted under 35 U.S.C. 154(b) by 0 days.

(21) Appl. No.: 14/019,772

(22) Filed: Sep. 6, 2013

(65) Prior Publication Data
US 2014/0217472 A1  Aug. 7, 2014

(30) Foreign Application Priority Data
Feb. 6, 2013  (TW) .............................. 102104500 A

(51) Int. Cl.
| | |
|---|---|
| H01L 21/311 | (2006.01) |
| H01L 21/02 | (2006.01) |
| H01L 29/737 | (2006.01) |
| H01L 29/778 | (2006.01) |
| H01L 29/417 | (2006.01) |
| H01L 29/423 | (2006.01) |

(52) U.S. Cl.
CPC ......... *H01L 21/02282* (2013.01); *H01L 29/778* (2013.01); *H01L 29/41708* (2013.01); *H01L 29/42316* (2013.01); *H01L 29/7371* (2013.01)

(58) Field of Classification Search
CPC ...................... H01L 21/02282; H01L 29/7325; H01L 29/737; H01L 29/778
USPC .......... 438/696, 780, 319, 343; 257/194, 197, 257/586
See application file for complete search history.

(56) References Cited

U.S. PATENT DOCUMENTS

| | | | | |
|---|---|---|---|---|
| 5,589,687 | A * | 12/1996 | Kawata et al. ............. | 250/338.3 |
| 5,614,423 | A * | 3/1997 | Matsuoka et al. ........... | 438/312 |
| 2004/0058485 | A1* | 3/2004 | Makiyama et al. .......... | 438/182 |
| 2005/0145851 | A1* | 7/2005 | Johnson et al. .................. | 257/76 |
| 2007/0066080 | A1* | 3/2007 | Kugler et al. ................. | 438/725 |

* cited by examiner

*Primary Examiner* — Tu-Tu Ho
(74) *Attorney, Agent, or Firm* — Muncy, Geissler, Olds & Lowe, P.C.

(57) ABSTRACT

A method for fabricating a mesa sidewall with a spin coated dielectric material and a semiconductor element fabricated by the same are provided in the present invention. The method includes the steps of: disposing an object on a semiconductor substrate; performing a spin coating process to coat with a liquid dielectric material; performing a drying process to dry the liquid dielectric material; performing a first etching process to remove an upper part of the dried dielectric material to expose a metal part (unaffected by ion bombardment) of the object; performing a deposition process to insulate the metal part (unaffected by ion bombardment) of the object; and performing a second etching process to form a semiconductor element with a mesa sidewall.

6 Claims, 20 Drawing Sheets

METHOD FOR FABRICATING MESA SIDEWALL WITH SPIN COATED DIELECTRIC MATERIAL AND SEMICONDUCTOR ELEMENT THEREOF

This application claims the benefit of TW Application No. 102104500 filed on Feb. 2, 2013, the content of which is hereby incorporated by reference.

BACKGROUND OF THE INVENTION

1. Field of Invention

The present invention relates in general to the technology of fabricating semiconductors, and more particularly to a method for fabricating a mesa sidewall with a spin coated dielectric material.

2. Related Art

High-speed III-V electronic devices have played a key role in broadband communication. They are extensively used in wireless communication equipment, and have proved to be indispensable in the 40 Gb/s optical fiber communication system as well. Recent years witness the ever-growing demand for larger broadband width and higher speed as technology advances. People have started to pay attention to circuits with an operating frequency higher than 300 GHz and the realization of terahertz transistors, as seen applied in wireless communication, security maintenance, biomedical examination, radio frequency signal transmission, radar, high frequency imaging, and etc.

Among the more common III-V compound semiconductors, the system of materials that grows on substrates of gallium arsenide (GaAs) and indium phosphide (InP) are regarded as crucial materials to achieve higher operating frequencies because of their higher electron mobility. A heterojunction bipolar transistor (HBT) in said system is a vertical element, and therefore the period of its transmission can be controlled through the thickness of an epitaxial layer. Compared with high electron mobility transistors (HEMTs) of horizontal conductivity, HBTs are considered a better option since they are more likely to reach a high electric current and a high operating frequency. However, such elements have a very high defect rate due to the fabrication process. Generally, such elements need a mesa sidewall for support to avoid damage.

The current conventional process for fabricating a mesa sidewall is mainly applied to forming a surface insulation layer, coating passivation, enhancing mechanical strength, and so on. Therefore, not only does a film of the mesa sidewall have to grow isotropically, the mesa sidewall must have good insulation, a lower dielectric coefficient (reduced parasitic capacitance and inductance), good ability to fill up gaps, a low thermal expansion coefficient, and good surface coating effect. Current conventional methods for growing a dielectric sidewall are mainly plasma enhanced chemical vapor deposition (PECVD), inductively coupled plasma chemical vapor deposition (ICP-CVD), atomic layer deposition (ALD), and etc. Among them, PECVD has a good coating effect but ion bombardment would occur when the sidewall grows, which in turn increases leakage current in the element. ICP-CVD has a poor ability to fill up gaps and tends to form holes. ALD has a good ability to fill up gaps and a good surface coating effect; its drawback is slow growth, which slows down the overall fabrication speed.

SUMMARY OF THE INVENTION

The first objective of the present invention is to provide a method for fabricating a mesa sidewall with a spin coated dielectric material, thereby enhancing the mechanical strength of the element.

Another objective of the present invention is to provide a method for fabricating a mesa sidewall with a spin coated dielectric material so as to prevent the element from collapsing.

Another objective of the present invention is to provide a semiconductor element fabricated by said method to enhance its physical strength.

In order to achieve said objectives and others, the present invention provides a method for fabricating a mesa sidewall with a spin coated dielectric material. The method includes the following steps: disposing an object on a semiconductor substrate, the object having a structure unaffected by ion bombardment; performing a spin coating process to coat with a liquid dielectric material; performing a drying process to dry the liquid dielectric material; performing a first etching process to remove a part of the dried dielectric material so as to expose the structure unaffected by ion bombardment; performing a deposition process to insulate the structure unaffected by ion bombardment of the object; and performing a second etching process to form a semiconductor element with a mesa sidewall.

In accordance with the exemplary embodiments of the present invention, the liquid dielectric materials used in the spin coating process may include: Benzocyclobutene (BCB), Polyimide (PI), or Spin on Glass (SOG). The deposition process in the method includes steps of performing a plasma enhanced chemical vapor deposition process (PECVD) process or performing an inductively coupled plasma chemical vapor deposition (ICP-CVD) process.

The present invention further provides a method for fabricating a mesa sidewall with a spin coated dielectric material. The method includes steps of disposing an object having a wide-top-narrow-bottom structure on a semiconductor substrate; performing a spin coating process to coat with a liquid dielectric material; performing a drying process to dry the liquid dielectric material; performing an etching process to form a semiconductor element with a mesa sidewall.

In accordance with the exemplary embodiments of the present invention, the object used in the method has a wide-top-narrow-bottom metal layer. The object is formed by the following steps: forming a wide-top-narrow-bottom T-shape metal; and performing a wet etching process to define a mesa for disposing the T-shape metal. The wet etching process further includes steps of: anisotropically etching the dried dielectric material to form a mesa sidewall on the object having the wide-top-narrow-bottom structure.

In accordance with the exemplary embodiments of the present invention, the object used in the method is formed by the following steps: forming a metal layer over a semiconductor doping area; performing a wet etching process to form a mesa and an undercut structure. The spin coating process in the method includes steps of: coating a semiconductor sample with the liquid dielectric material so that the liquid dielectric material fills gaps in the undercut structure. The etching process in the method further includes steps of: anisotropically etching the dried dielectric material to form a mesa sidewall on the object having a wide-top-narrow-bottom structure.

In accordance with the exemplary embodiments of the present invention, the object used in the method is a heterojunction bipolar transistor (HBT). The HBT includes the semiconductor substrate, a base mesa, an emitter mesa, an emitter metal and a base metal. The semiconductor substrate includes a collector, a sub-collector and a stress buffer layer. The base mesa is disposed over the semiconductor substrate. The emitter mesa is disposed over the base mesa. The emitter metal is disposed over the emitter mesa. The width of the emitter metal is larger than or equal to that of the emitter mesa. After forming the emitter metal and the emitter mesa, performing a self-alignment process to form a base metal at the side and the top of the emitter metal. The thickness of the base metal is smaller than that of the emitter mesa, and a first predetermined fixed distance exists between the base metal and the emitter mesa. The spin coating process includes steps of: coating a semiconductor sample with the liquid dielectric material so that the liquid dielectric material fills gaps between the emitter mesa and the base metal.

According to said fabrication process of the HBT, after performing an etching process the fabrication process further includes steps of: performing a deposition process to insulate a metal part of the object (or a structure unaffected by ion bombardment); performing a second etching process to remove the insulation by the deposition process and excessive dried dielectric material; and performing a third etching process to remove a base material and a collector material in and outside the base metal.

In accordance with the exemplary embodiments of the present invention, the object used in the method for fabricating a mesa sidewall with a spin coated dielectric material is a high electron mobility transistor (HEMT). The HEMT includes a T-shape gate metal, a first source/drain metal and a second source/drain metal. The T-shape gate metal is disposed on the semiconductor substrate and has a wide-top-narrow-bottom structure, including a head metal and a foot metal. After performing an etching process the method further includes steps of: performing a deposition process to insulate a metal part (or a structure unaffected by ion bombardment) of the object; performing a second etching process to remove the insulation by the deposition process and excessive dried dielectric material; and performing a self-alignment process to form source/drain metals at the sides of the T-shape gate metal.

The present invention further provides a semiconductor element. The semiconductor element includes a semiconductor substrate, an object and a dielectric material. The object is disposed on the semiconductor substrate. The dielectric material is disposed at and connected to the sides of the object.

In accordance with the exemplary embodiments of the semiconductor element of the present invention, the object is an HBT. The HBT includes the semiconductor substrate, a base mesa, an emitter mesa, an emitter metal, and a base metal. The semiconductor substrate includes a collector, a sub-collector, and a buffer layer material. The base mesa is disposed over the semiconductor substrate. The emitter mesa is disposed over the base mesa. The emitter metal is disposed over the emitter mesa. The width of the emitter metal is larger than or equal to the width of the emitter mesa. After completing fabrication of the emitter metal and the emitter mesa, a self-aligned process is performed to form the base metal beside and on the top of the emitter metal. The thickness of the base metal is smaller than that of the emitter mesa, and a predetermined fixed distance exists between the base metal and the emitter mesa. The base metal is disposed over the base mesa and at the two sides of the emitter mesa, and a predetermined fixed distance exists between the base metal and the emitter mesa. The dielectric material is disposed between the emitter metal and the base mesa; the dielectric material is disposed between the first base metal and the emitter mesa, and the dielectric material is disposed between the base metal and the emitter mesa.

In accordance with the exemplary embodiments of the semiconductor element of the present invention, the object is an HEMT. The HEMT includes a T-shape gate metal, a first source/drain metal, and a second source/drain metal. The T-shape gate metal is disposed on the semiconductor substrate and has a wide-top-narrow-bottom structure. The first source/drain metal is disposed on the semiconductor substrate and at one side of the T-shape gate metal. The second source/drain metal is disposed on the semiconductor substrate and at the other side of the T-shape gate metal. The dielectric material is disposed between the head metal and the foot metal of the T-shape gate metal. The dielectric material is disposed between the first source/drain metal and the foot metal of the T-shape gate metal. The dielectric material is disposed between the second source/drain metal and the foot metal of the T-shape gate metal.

The spirit of the present invention is to coat the semiconductor sample with the liquid dielectric material, to expose the upper metal object (or the structure unaffected by ion bombardment) of the semiconductor element by an etching process so as to form an insulation oxidation sidewall or an extended protrusion ($SiO^2$ or $SiNx$), and further to use the sidewall or the extended protrusion as an etching mask to anisotropically etch and remove the exposed liquid dielectric material so that a mesa sidewall made from the liquid dielectric material is formed. This process can substitute the deposition process in the conventional art to avoid unnecessary damage to the element. Beside, the process also enhances the mechanical strength thereof.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

The present invention will be apparent from the following detailed description, which proceeds with reference to the accompanying drawings, wherein the same references relate to the same elements.

The present invention will become more fully understood from the detailed description given hereinafter and the accompanying drawings are given by way of illustration only, and thus are not limitative of the present invention.

The First Embodiment

Figure 1A:
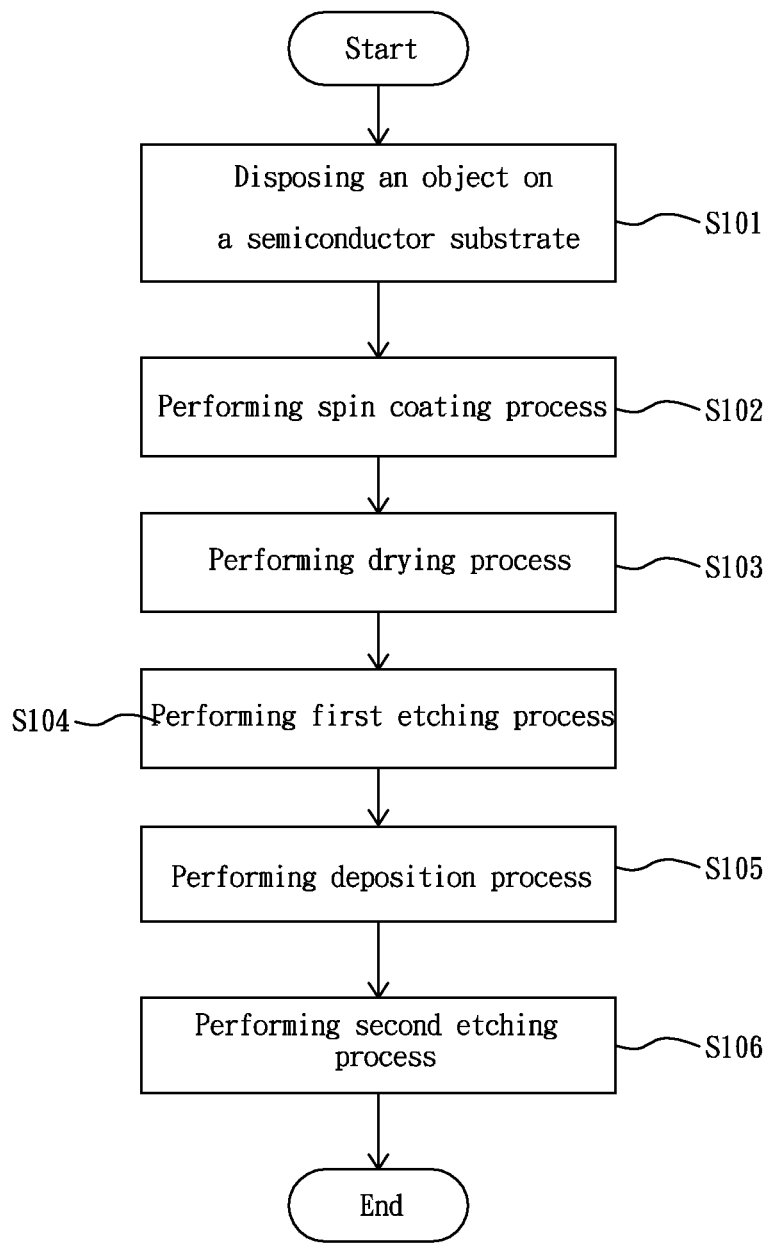
FIG. 1A is a flow chart depicting a method for fabricating a mesa sidewall with a spin coated dielectric material according to the first embodiment of the present invention.
Figure 1B:
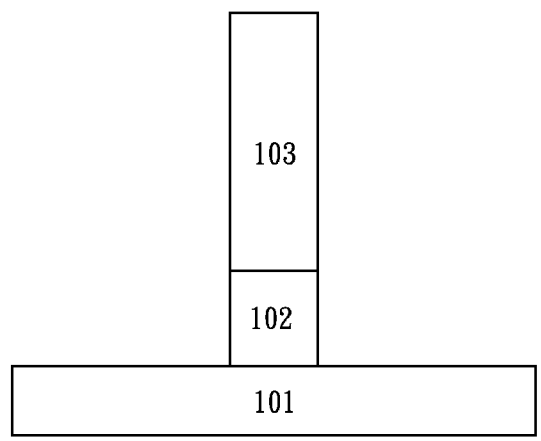
FIG. 1B is a schematic drawing of a step S101 in the method for fabricating a mesa sidewall with a spin coated dielectric material according to the first embodiment of the present invention.

FIG. 1A is a flow chart depicting a method for fabricating a mesa sidewall with a spin coated dielectric material according to the first embodiment of the present invention. As seen in FIG. 1A, said method for fabricating a mesa sidewall with a spin coated dielectric material includes the following steps:

Step S101: Disposing an object on a semiconductor substrate. FIG. 1B shows a schematic drawing of Step S101 in the method for fabricating a mesa sidewall with a spin coated dielectric material according to the first embodiment of the present invention. As seen in FIG. 1B, 101 is a semiconductor substrate; 102 is a mesa structure to be coated with a liquid dielectric material; 103 is a structure unaffected by ion bombardment, and generally 103 may be a metal, a high doped semiconductor or a dielectric material. For the convenience of explanation, a metal is used as an example. Generally, 102, the mesa structure to be coated with a liquid dielectric material, can be viewed as one of those semiconductor materials more prone to ion bombardment or having a higher surface recombination velocity (S.R.V.), particularly such as a low doped semiconductor, an intrinsic semiconductor, or semiconductors with smaller energy bands or energy gaps. Since some of the processes previously performed, such as PECVD, ICP-CVD and so forth, tend to cause damage to more intrinsic semiconductors or lower doped semiconductors and lead to weaknesses like increased leakage current, the following steps can completely solve the problem.

Figure 1C:
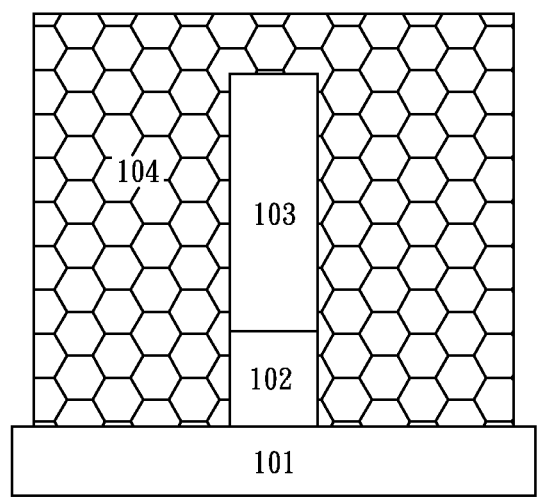
FIG. 1C is a schematic drawing of a step S102 in the method for fabricating a mesa sidewall with a spin coated dielectric material according to the first embodiment of the present invention.

Step S102: Performing a spin coating process to coat with a liquid dielectric material. FIG. 1C is a schematic drawing of Step S102 in the method for fabricating a mesa sidewall with a spin coated dielectric material according to the first embodiment of the present invention. As seen in FIG. 1C, a dielectric material 104, used in the spin coating process, may be BCB, PI, or SOG. All said materials have one common characteristic that they do not react with semiconductors, nor do they affect the doping of semiconductors, and therefore they are easy to implement.

Step S103: Performing a drying process to dry the liquid dielectric material. After the spin coating process the liquid dielectric material has to undergo a drying process to take shape so that the liquid dielectric material becomes solid dielectric material.

Figure 1D:
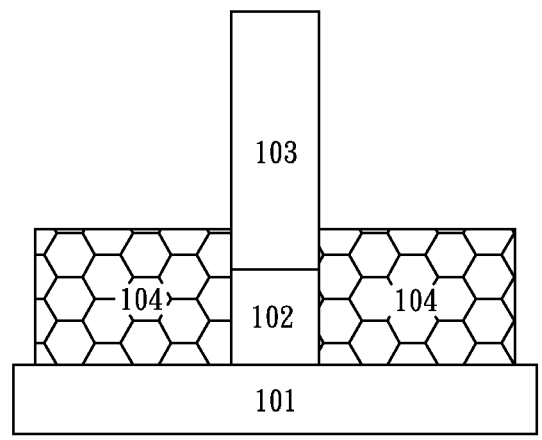
FIG. 1D is a schematic drawing of a step S104 in the method for fabricating a mesa sidewall with a spin coated dielectric material according to the first embodiment of the present invention.

Step S104: Performing a first etching process to remove a part of the dried dielectric material so as to expose a metal part (or a structure unaffected by ion bombardment) of the object. FIG. 1D is a schematic drawing of Step S104 in the method for fabricating a mesa sidewall with a spin coated dielectric material according to the first embodiment of the present invention. As seen in FIG. 1D, after etching the dried substrate, dried dielectric material 104 decreases and the metal part (or the structure unaffected by ion bombardment) of the object is exposed.

Figure 1E:
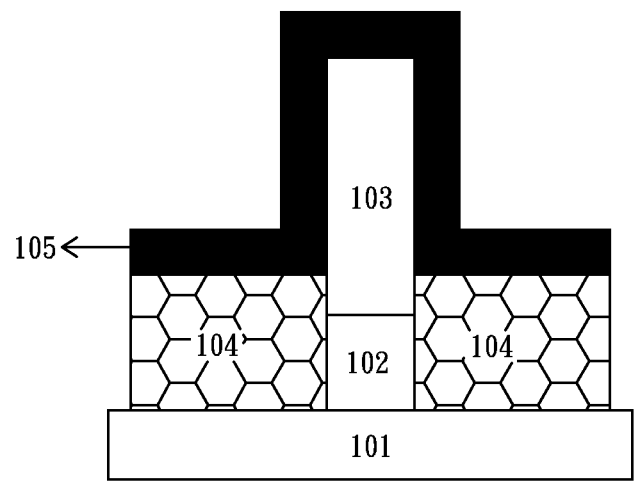
FIG. 1E is a schematic drawing of a step S105 in the method for fabricating a mesa sidewall with a spin coated dielectric material according to the first embodiment of the present invention.

Step S105: Performing a deposition process to insulate the metal part (or the structure unaffected by ion bombardment) of the object. FIG. 1E is a schematic drawing of Step S105 in the method for fabricating a mesa sidewall with a spin coated dielectric material according to the first embodiment of the present invention. As seen in FIG. 1E, in this embodiment, the deposition process may be PECVD, ICP-CVD, or electron cyclotron resonance CVD (ECR-CVD) to grow an insulation material 105 ($SiO^2$ or SiNx). Insulation material 105 will be used as an etching mask later.

Figure 1F:
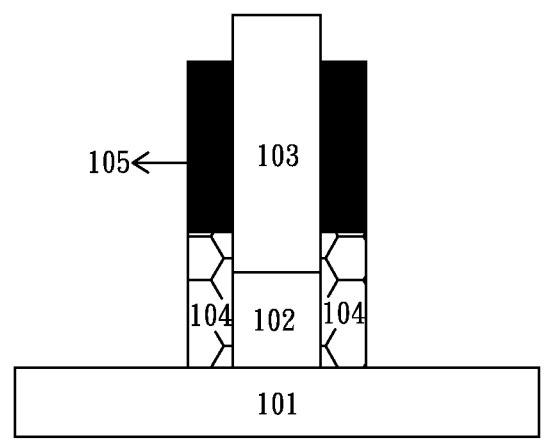
FIG. 1F is a schematic drawing of a step S106 in the method for fabricating a mesa sidewall with a spin coated dielectric material according to the first embodiment of the present invention.

Step S106: Performing a second etching process to form a semiconductor element with a mesa sidewall. FIG. 1F a schematic drawing of Step S106 in the method for fabricating a mesa sidewall with a spin coated dielectric material according to the first embodiment of the present invention. As seen in FIG. 1F, since the thickness of insulation material 105 ($SiO^2$ or SiNx) on the sidewall is far larger than the thickness of the rest of insulation material 105 and since dielectric material 104 has a faster etching speed than insulation material 105, after the second etching process, the rest of the thin insulation material 105 and dielectric material 104 are completely removed and only a small part of insulation material 105 on the sidewall is removed. Therefore, insulation material 105 can be used as an etching mask for dielectric material 104, and no extra mask is required to protect the sidewall of the element, thereby significantly reducing the production cost.

As can be seen from the first embodiment, semiconductor 102, which is more sensitive to CVD, will be coated by dielectric material 104. Therefore, the doping inside semiconductor 102 is not influenced by said PECVD, ICP-CVD, or ECR-CVD process. In other words, such a process prevents damage to the element.

The Second Embodiment

Figure 2A:
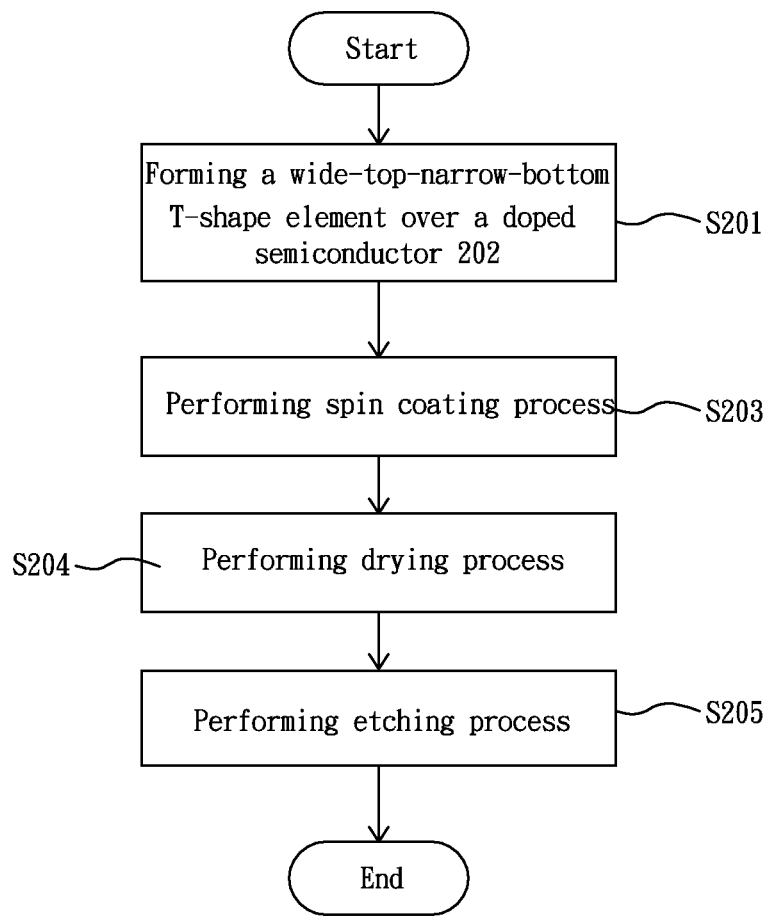
FIG. 2A is a flow chart depicting a method for fabricating a mesa sidewall with a spin coated dielectric material according to the second embodiment of the present invention.
Figure 2B:
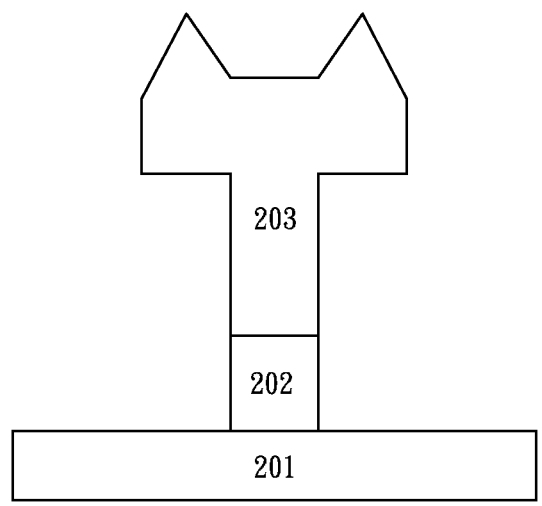
FIG. 2B is a schematic drawing of a step S201 in the method for fabricating a mesa sidewall with a spin coated dielectric material according to the second embodiment of the present invention.

FIG. 2A is a flow chart depicting a method for fabricating a mesa sidewall with a spin coated dielectric material according to the second embodiment of the present invention. FIG. 2B is a schematic drawing of Step S201 in the method according to the second embodiment of the present invention. As seen in FIG. 2B, in this embodiment, the element has a wide-top-narrow-bottom structure similar to the English alphabet "T." Fabrication processes vary with different shapes.

Next, reverting back to FIG. 2A, the method for fabricating a mesa sidewall with a spin coated dielectric material includes the following steps:

Step S201: Forming a wide-top-narrow-bottom T-shape element over a semiconductor 201, as seen in 203 and 202 of FIG. 2B.

Figure 2C:
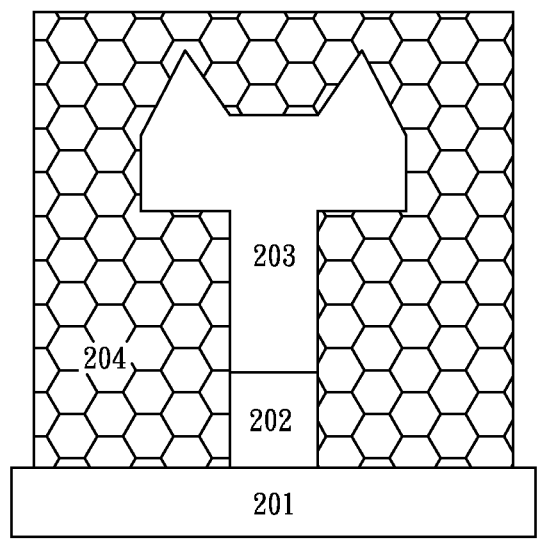
FIG. 2C is a schematic drawing of a step S203 in the method for fabricating a mesa sidewall with a spin coated dielectric material according to the second embodiment of the present invention.

Step S203: Performing a spin coating process to coat with a liquid dielectric material. FIG. 2C is a schematic drawing of Step S203 in the method for fabricating a mesa sidewall with a spin coated dielectric material according to the second embodiment of the present invention. As seen in FIG. 2C, Step S203 is the same as Step S102, and likewise, a dielectric material 204, used in the spin coating process, may be BCB, PI, or SOG. Said materials all have one common characteristic that they do not react with a semiconductor 202, nor do they influence the doping in semiconductor 202, and therefore they are easy to implement.

Step S204: Performing a drying process to dry the liquid dielectric material. Since Step S204 is the same as Step S103, explanation is omitted to avoid repetition.

Figure 2D:
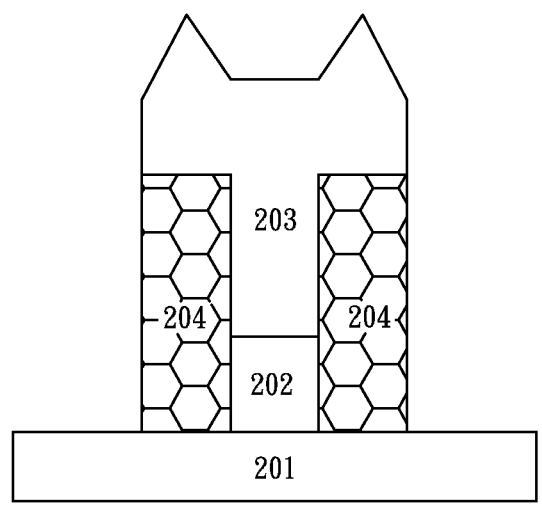
FIG. 2D is a schematic drawing of a step S205 in the method for fabricating a mesa sidewall with a spin coated dielectric material according to the second embodiment of the present invention.

Step S205: Performing an etching process to form a semiconductor element having a mesa sidewall. FIG. 2D is a schematic drawing of Step S205 in the method for fabricating a mesa sidewall with a spin coated dielectric material according to the second embodiment of the present invention. As seen in FIG. 2D, a T-shape metal 203 is a wide-top-narrow-bottom structure and therefore forms a natural mask. Hence, this etching process does not require an extra mask and is performed directly to form a dielectric sidewall 204 as shown in FIG. 2D.

From the second embodiment, people ordinarily skilled in the art can see that the greatest weakness of the wide-top-narrow-bottom structure is its insufficient mechanical strength, which often causes the element to collapse. With the penetrating characteristic of the liquid dielectric material, the fabrication process of the second embodiment strengthens the mesa sidewall and the mechanical strength of the element, thereby reducing its likelihood of collapse.

The Third Embodiment

Figure 3A:
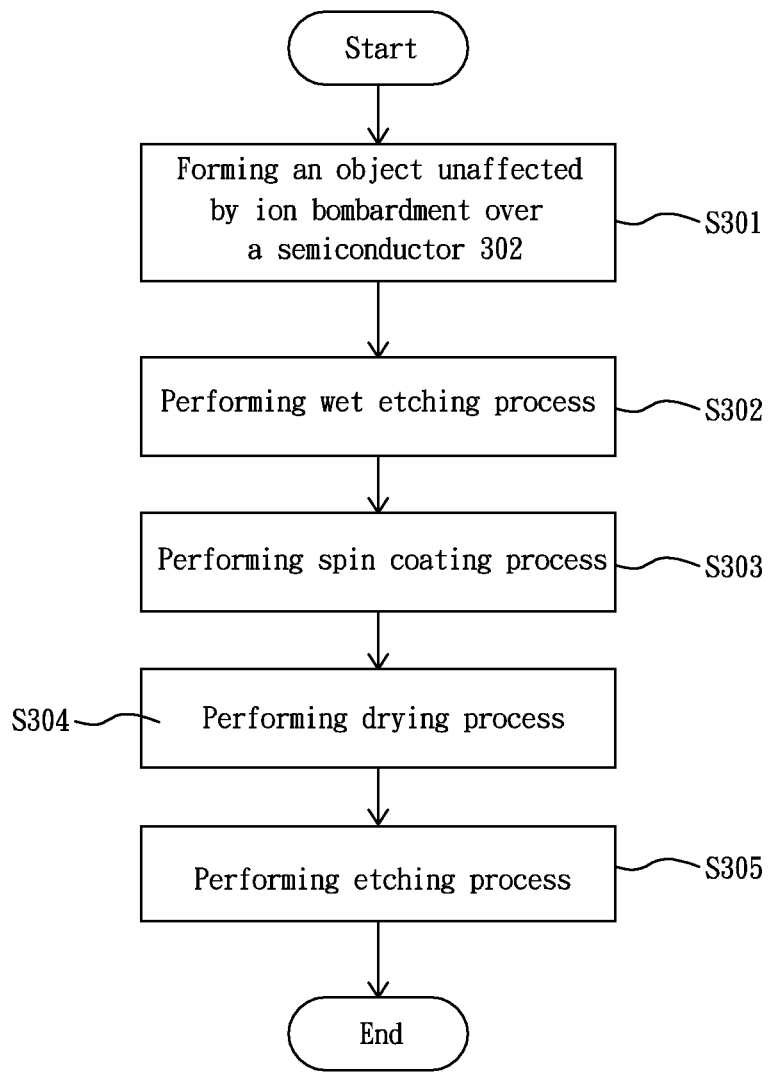
FIG. 3A is a flow chart depicting a method for fabricating a mesa sidewall with a spin coated dielectric material according to the third embodiment of the present invention.
Figure 3B:
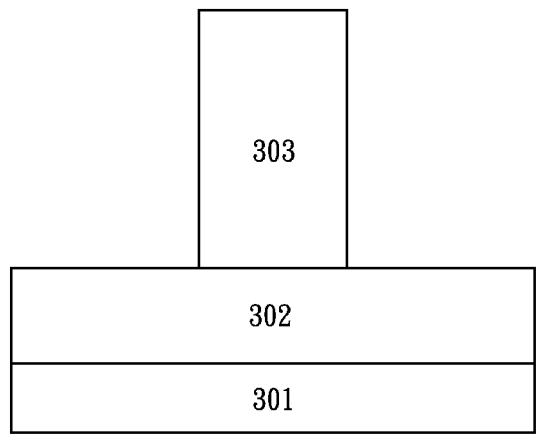
FIG. 3B is a schematic drawing of a step S301 in the method for fabricating a mesa sidewall with a spin coated dielectric material according to the third embodiment of the present invention.

FIG. 3A is a flow chart depicting a method for fabricating a mesa sidewall with a spin coated dielectric material according to the third embodiment of the present invention. FIG. 3B is a schematic drawing of Step S301 in the method according to the third embodiment of the present invention. As seen in FIG. 3B, in the third embodiment, the structure of the element has a metal 303 (or a structure unaffected by ion bombardment) disposed over a semiconductor 302, and semiconductor 302 disposed over a semiconductor substrate 301. Unlike the third embodiment, the metal of the second embodiment has a wide-top-narrow-bottom shape similar to the English alphabet "T," while in the third embodiment a wet etching process is performed to form an undercut structure at gaps filled with the dielectric material.

Next, reverting back to FIG. 3A, the method for fabricating a mesa sidewall with a spin coated dielectric material has the following steps:

Step S301: First forming a metal 303 over the doped semiconductor 302, as seen in 303 of FIG. 3B.

Figure 3C:
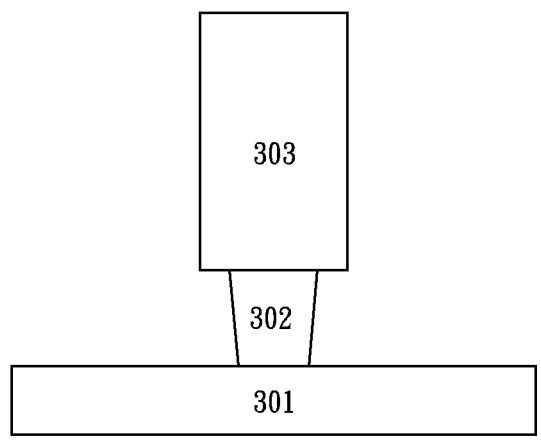
FIG. 3C is a schematic drawing of a step S302 in the method for fabricating a mesa sidewall with a spin coated dielectric material according to the third embodiment of the present invention.

Step S302: Performing a wet etching process to define a mesa for disposing metal 303. FIG. 3C is a schematic drawing of Step S302 in the method for fabricating a mesa sidewall with a spin coated dielectric material according to the third embodiment of the present invention. As seen in FIG. 3C, the wet etching process forms a mesa and an undercut structure in semiconductor 302. People ordinarily skilled in the art can see that the undercut structure of semiconductor 302 is covered by metal 303, thus forming a wide-top-narrow-bottom shape. Such a shape reduces the mechanical strength of the element. On the other hand, although a wet etching process leaves the undercut structure with the drawback of insufficient mechanical strength, in some fabrication processes, the undercut structure actually reduces parasitic capacitance and improves high frequency response. Besides, the production cost of a wet etching process is relatively low.

Figure 3D:
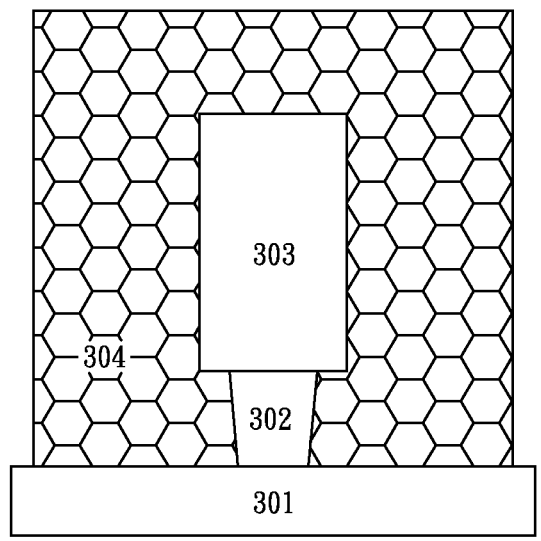
FIG. 3D is a schematic drawing of a step S303 in the method for fabricating a mesa sidewall with a spin coated dielectric material according to the third embodiment of the present invention.

Step S303: Performing a spin coating process to coat with a liquid dielectric material. FIG. 3D is a schematic drawing of Step S303 in the method for fabricating a mesa sidewall with a spin coated dielectric material according to the third embodiment of the present invention. As seen in FIG. 3D, Step S303 is the same as Step S102. Likewise, a dielectric material 304, used in the spin coating process, may be BCB, PI, or SOG. Said materials all have one common characteristic that they do not react with semiconductor 302, nor do they influence the doping in semiconductor 302, and therefore they are easy to implement.

Step S304: Performing a drying process to dry the liquid dielectric material. Since Step S304 is the same as Steps S103 and S204, explanation is omitted to avoid repetition.

Figure 3E:
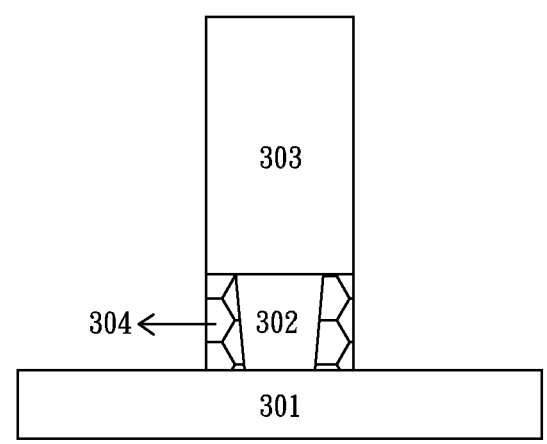
FIG. 3E is a schematic drawing of a step S305 in the method for fabricating a mesa sidewall with a spin coated dielectric material according to the third embodiment of the present invention.

Step S305: Performing an etching process to form a semiconductor element having a mesa sidewall. FIG. 3E is a schematic drawing of Step S305 in the method for fabricating a mesa sidewall with a spin coated dielectric material according to the third embodiment of the present invention. As seen in FIG. 3E, since semiconductor 302 and metal 303 compose a wide-top-narrow-bottom structure, which then serves as a natural mask, this etching process does not require an extra mask and is performed directly to form dielectric sidewall 304 as shown.

According to the third embodiment, people ordinarily skilled in the art can see that the mesa sidewall of the wide-top-narrow-bottom element can be strengthened by the spin coating process, and that the mechanical strength of the element is also enhanced, thereby reducing its likelihood of collapse.

The Fourth Embodiment

Figure 4A:
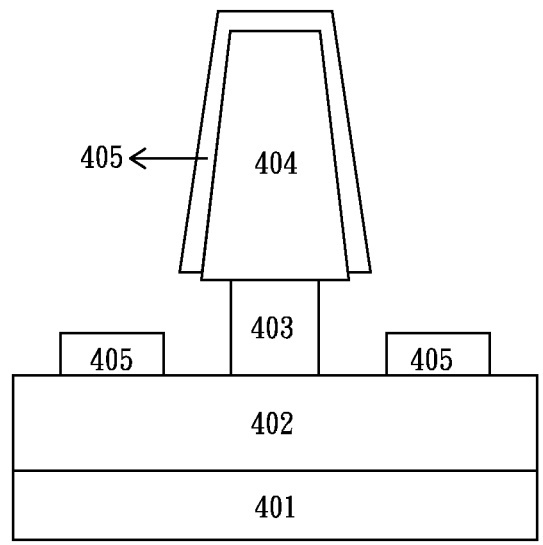
FIG. 4A illustrates a structure of a semiconductor element, whose mesa sidewall is to be fabricated with a spin coated dielectric material according to the fourth embodiment of the present invention.

FIG. 4A illustrates a structure of a semiconductor element, whose mesa sidewall is to be fabricated with a spin coated dielectric material according to the fourth embodiment of the present invention. As seen in FIG. 4A, the semiconductor element is an HBT. The HBT includes a semiconductor substrate 401, a base mesa 402, an emitter mesa 403, an emitter metal 404, and a base metal 405. The semiconductor substrate 401 may be a collector, a sub-collector, or a buffer layer material. Base mesa 402 is disposed over semiconductor substrate 401. Emitter mesa 403 is disposed over base mesa 402. Emitter metal 404 is disposed over emitter mesa 403. The width of emitter metal 404 is larger than that of emitter mesa 403. Base metal 405 is disposed over base mesa 402 and at the two sides of emitter mesa 403. The thickness of base metal 405 is smaller than that of emitter mesa 403. A predetermined fixed distance (gap) exists between base metal 405 and emitter mesa 403. Semiconductor substrate 401 can be a silicon substrate, an InP substrate, or an InGaAs substrate.

People ordinarily skilled in the art can see that the element of FIG. 4A is a HBT produced by a self-alignment process. Therefore, base metal 405 is still coated over emitter metal 404. Theoretically, the thickness of base metal 405 coated over emitter metal 404 should be the same as the thickness of a first base metal and a second base metal 405. FIG. 4A, being a schematic drawing, does not show the different parts of base metal 405 having the same thickness. However, people ordinarily skilled in the art should understand that during actual operation errors may occur, which in turn results in uneven thicknesses of base metal 405, and that the present invention is not limited to such a situation.

Figure 4B:
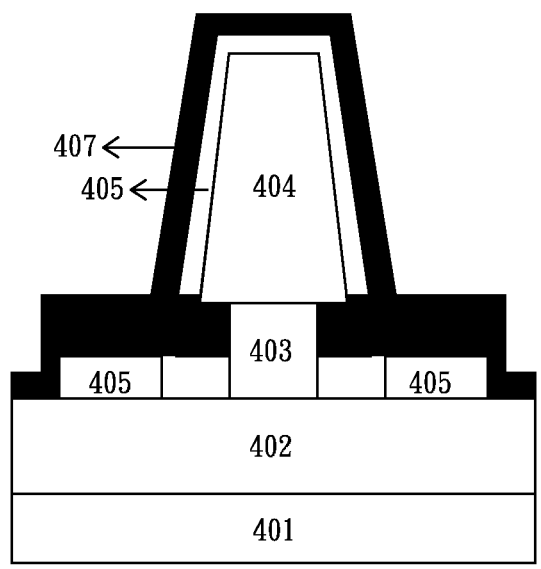
FIG. 4B is a schematic drawing depicting the result from using PECVD to fill gaps in the semiconductor element of FIG. 4A according to the conventional art.
Figure 4C:
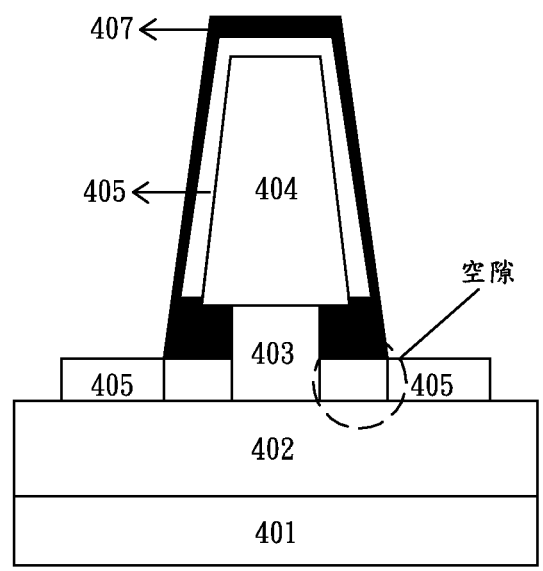
FIG. 4C is a schematic drawing depicting the result from using PECVD to fill gaps in the semiconductor element of FIG. 4A according to the conventional art.

FIG. 4B is a schematic drawing depicting the result from performing a PECVD process to fill gaps in the semiconductor of FIG. 4A according to the conventional art. FIG. 4C is a schematic drawing depicting the result from using a PECVD process to fill gaps in the semiconductor of FIG. 4A according to the conventional art. As seen in FIG. 4B, 407 is an insulation material isotropically grown by a PECVD process, an ICP-CVD process, or an ALD process. People ordinarily skilled in the art should be able to see that except for the insulation material grown by an ALD process, insulation materials grown by the other two processes can hardly fill in said gaps.

Next, as seen in FIG. 4C, techniques like PECVD, ICP-CVD, and so forth will leave gaps between base metal 405 and emitter mesa 403. Subsequently, a wet etching process has to be performed to remove the exterior side of base mesa 402 to reduce parasitic capacitance. However, the liquid from the wet etching process will fill gaps between base metal 405 and emitter mesa 403 and damage base mesa 402 below, which will cause damage to the element.

Figure 4D:
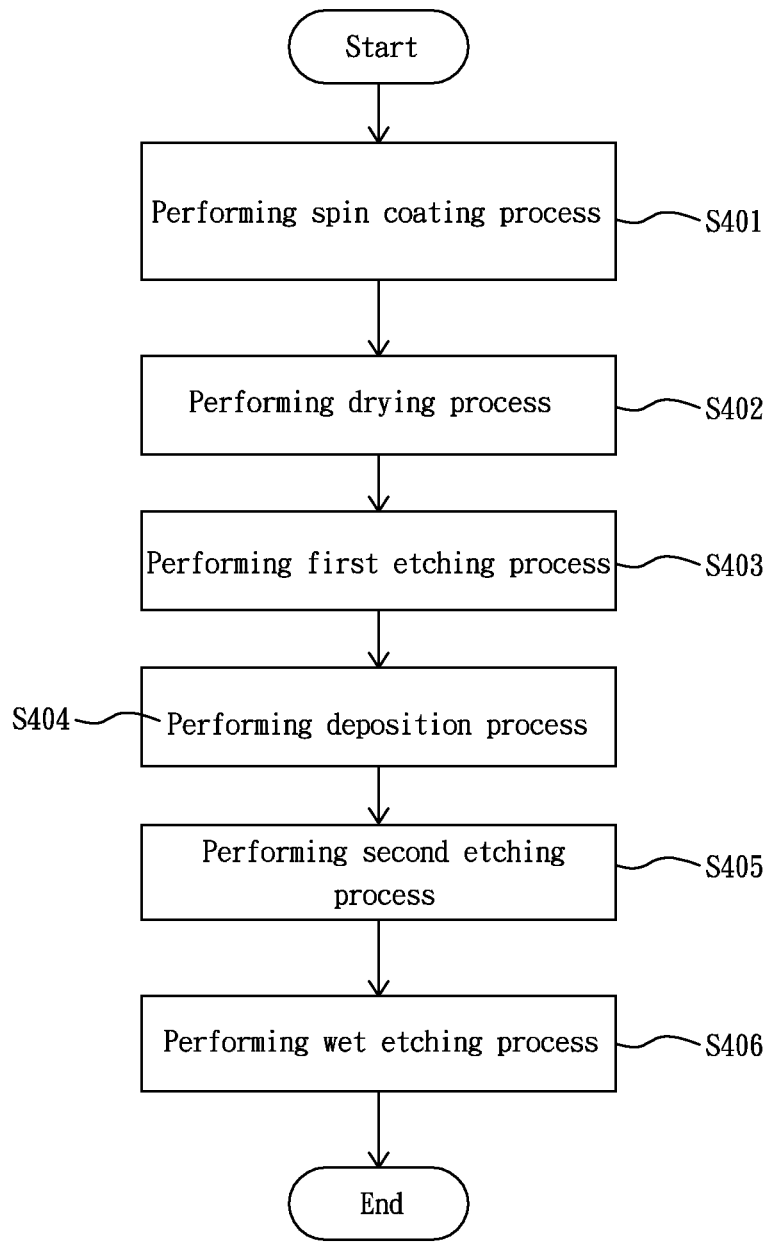
FIG. 4D is a flow chart depicting a method for fabricating a mesa sidewall with a spin coated dielectric material according to the fourth embodiment of the present invention.
Figure 4E:
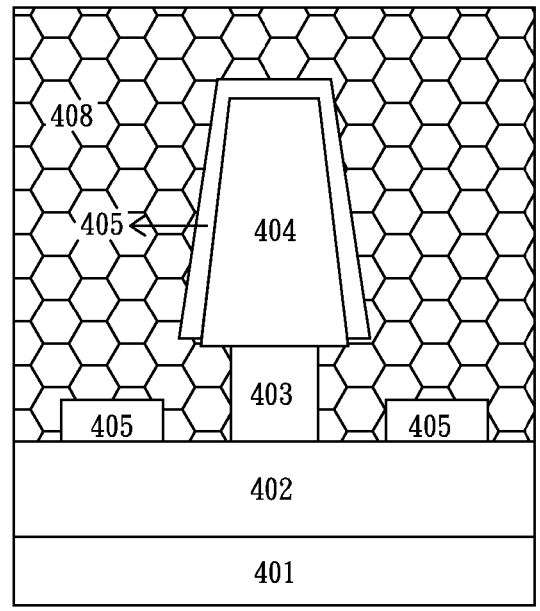
FIG. 4E is a schematic drawing of a step S401 in the method for fabricating a mesa sidewall with a spin coated dielectric material according to the fourth embodiment of the present invention.

FIG. 4D is a flow chart depicting a method for fabricating a mesa sidewall with a spin coated dielectric material according to the fourth embodiment of the present invention. As seen in FIG. 4D, said method includes the following steps:

Step S401: Performing a spin coating process to coat with a liquid dielectric material. FIG. 4E is a schematic drawing of Step S401 in the method for fabricating a mesa sidewall with a spin coated dielectric material according to the fourth embodiment of the present invention. As seen in FIG. 4E, a dielectric material 408 used in the spin coating process may be BCB, PI or SOG. Such liquid materials can easily infiltrate gaps and fill the gaps between base metal 405 and emitter mesa 403.

Step S402: Performing a drying process to dry the liquid dielectric material. Since this step is the same as Steps S103 and S204, explanation is omitted to avoid repetition.

Figure 4F:
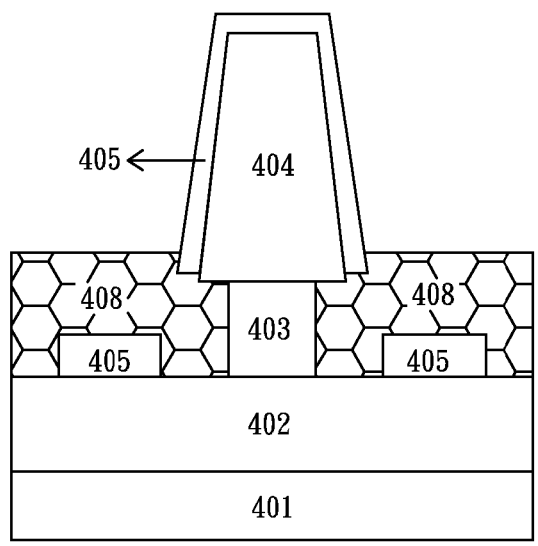
FIG. 4F is a schematic drawing of a step S403 in the method for fabricating a mesa sidewall with a spin coated dielectric material according to the fourth embodiment of the present invention.

Step S403: Performing a first etching process. FIG. 4F is a schematic drawing of Step S403 in the method for fabricating a mesa sidewall with a spin coated dielectric material according to the fourth embodiment of the present invention. As seen in FIG. 4F, emitter metal 404 will be exposed after the first etching process.

Figure 4G:
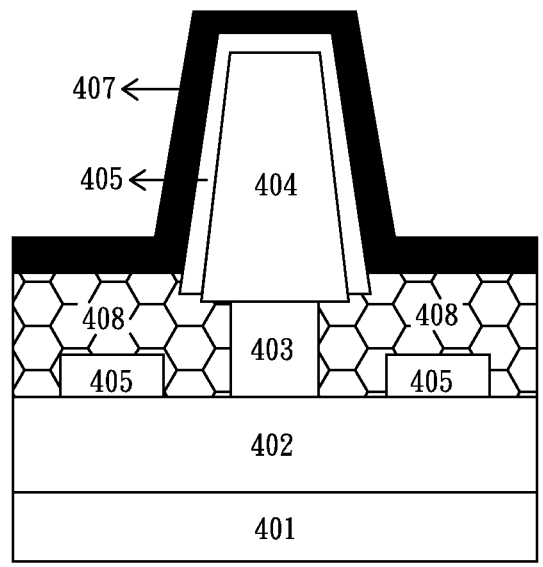
FIG. 4G is a schematic drawing of a step S404 in the method for fabricating a mesa sidewall with a spin coated dielectric material according to the fourth embodiment of the present invention.

Step S404: Performing a deposition process to insulate a metal part of the object (or a structure unaffected by ion bombardment). FIG. 4G is a schematic drawing of Step S404 in the method for fabricating a mesa sidewall with a spin coated dielectric material according to the fourth embodiment of the present invention. As seen in FIG. 4G, in this embodiment, the deposition process may be a PECVD, ICP-CVD or ECR-CVD process, employed to grow insulation material 407 ($SiO^2$ or SiNx), which will be used as an etching mask later.

Figure 4H:
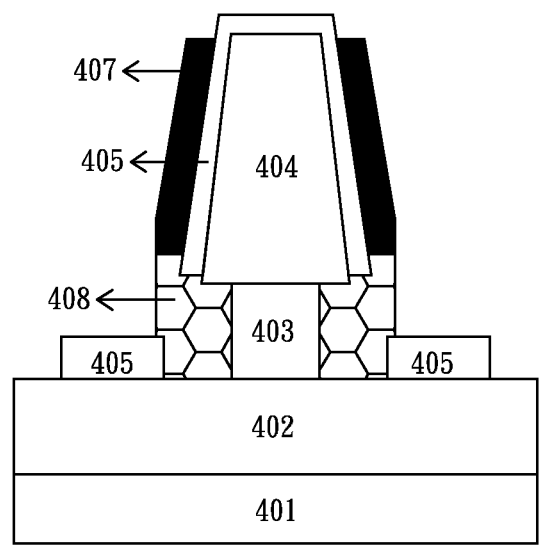
FIG. 4H is a schematic drawing of a step S405 in the method for fabricating a mesa sidewall with a spin coated dielectric material according to the fourth embodiment of the present invention.

Step S405: Performing a second etching process. FIG. 4H is a schematic drawing of Step S405 in the method for fabricating a mesa sidewall with a spin coated dielectric material according to the fourth embodiment of the present invention. As seen in FIG. 4H, since the thickness of insulation material 407 ($SiO^2$ or SiNx) on the sidewall is far larger than the thickness of the rest of insulation material 407, when performing the second etching process, the rest of the thin insulation material 407 and dielectric material 408 will be removed.

Figure 4I:
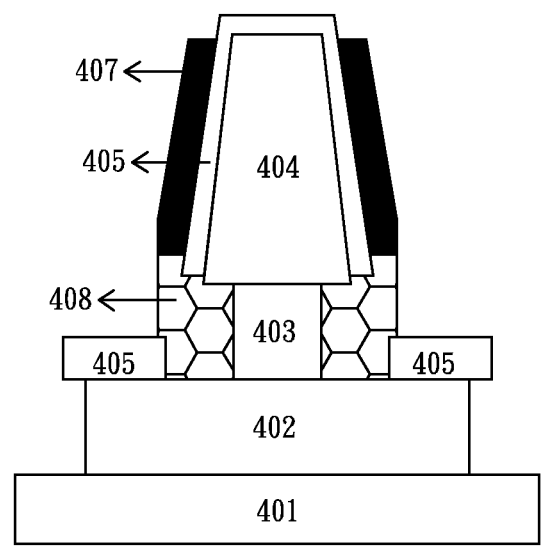
FIG. 4I is a schematic drawing of a step S406 in the method for fabricating a mesa sidewall with a spin coated dielectric material according to the fourth embodiment of the present invention.

Step S406: Performing a wet etching process. FIG. 4I is a schematic drawing of Step S406 in the method for fabricating a mesa sidewall with a spin coated dielectric material according to the fourth embodiment of the present invention. As seen in FIG. 4I, after completing the wet etching process, the exterior side of base mesa 402 is removed and an undercut structure is formed. Such an undercut structure reduces the parasitic capacitance effect and enhances high frequency resonance of the element.

The Fifth Embodiment

Figure 5A:
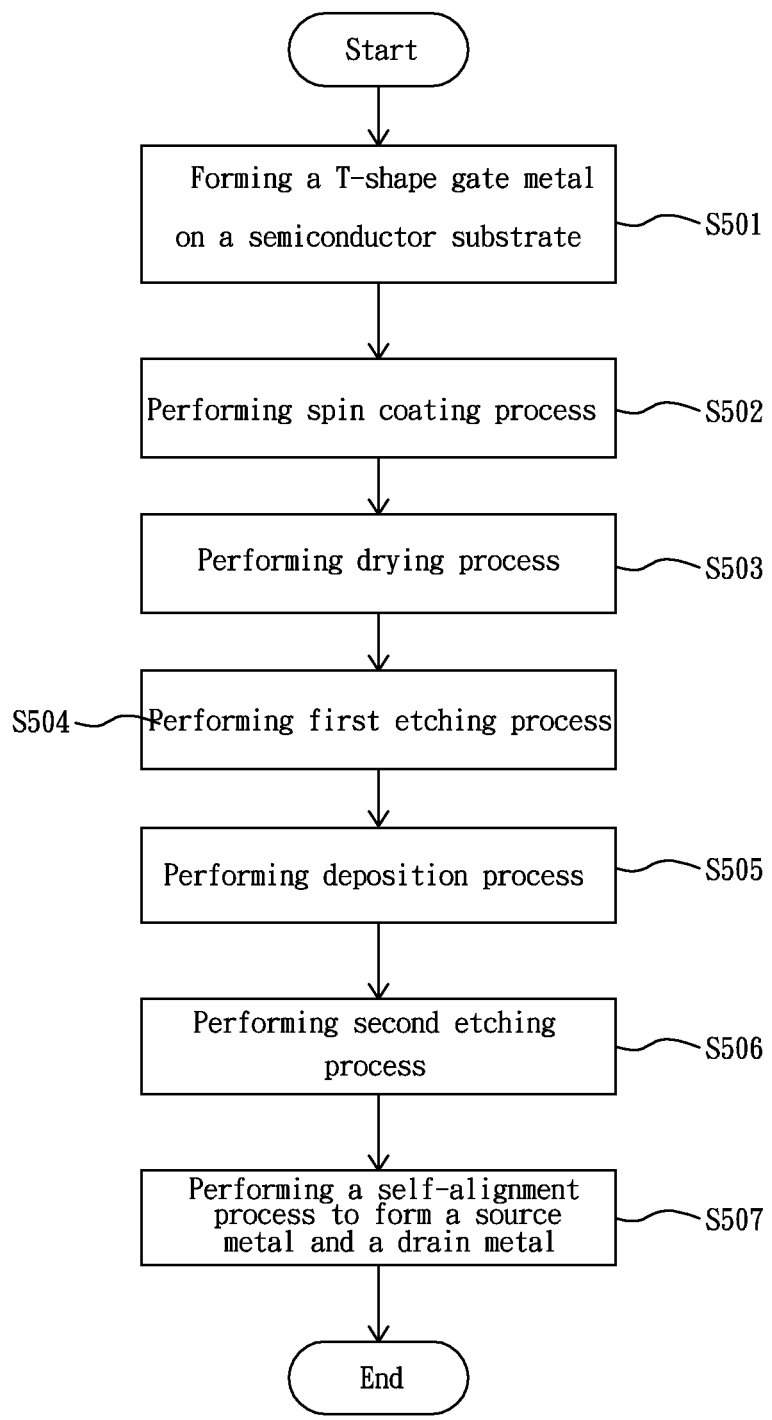
FIG. 5A is a flow chart depicting a method for fabricating a mesa sidewall with a spin coated dielectric material according to the fifth embodiment of the present invention.
Figure 5B:
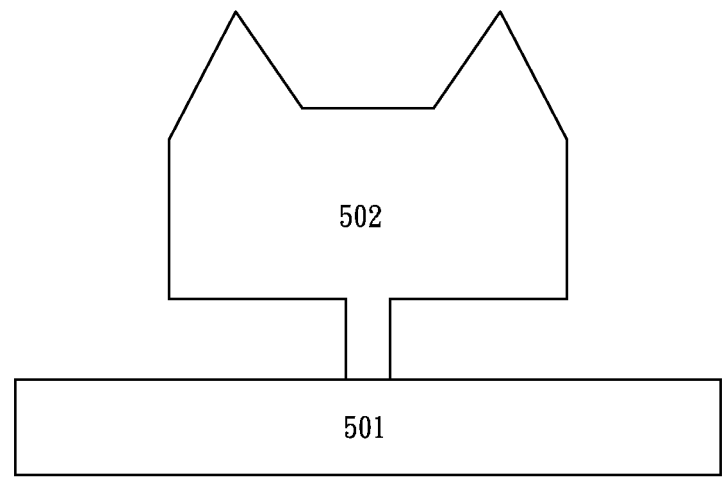
FIG. 5B is a schematic drawing of a step S501 in the method for fabricating a mesa sidewall with a spin coated dielectric material according to the fifth embodiment of the present invention.

FIG. 5A is a flow chart depicting a method for fabricating a mesa sidewall with a spin coated dielectric material according to the fifth embodiment of the present invention. FIG. 5B is a schematic drawing of Step S501 in the method according to the fifth embodiment of the present invention. As seen in FIG. 5B, in the fifth embodiment, the structure of the element has a wide-top-narrow-bottom shape like the English alphabet "T," which is similar to the structure of the element in the second embodiment. The structure of the element belongs to the structure of high electron mobility transistors (HEMTs). 501 is a semiconductor substrate; a metal 502 is a T-shape gate metal, whose structure is wide at the top and narrow at the bottom; metal 502 includes a head metal and a foot metal. The proportion between head metal and foot metal is more than 2:1-4:1. Foot metal is used for a gate, and head metal is used for a contact. People ordinarily skilled in the art can see that when a width of metal is minimum, its mechanical strength is insufficient and prone to collapse.

Next, reverting back to FIG. 5A, the method for fabricating a mesa sidewall with a spin coated dielectric material includes the following steps:

Step S501: Forming a T-shape gate metal on a semiconductor substrate, as seen in FIG. 5B.

Step S502: Performing a spin coating process to coat with a liquid dielectric material.

Step S503: Performing a drying process to dry the liquid dielectric material.

Figure 5C:
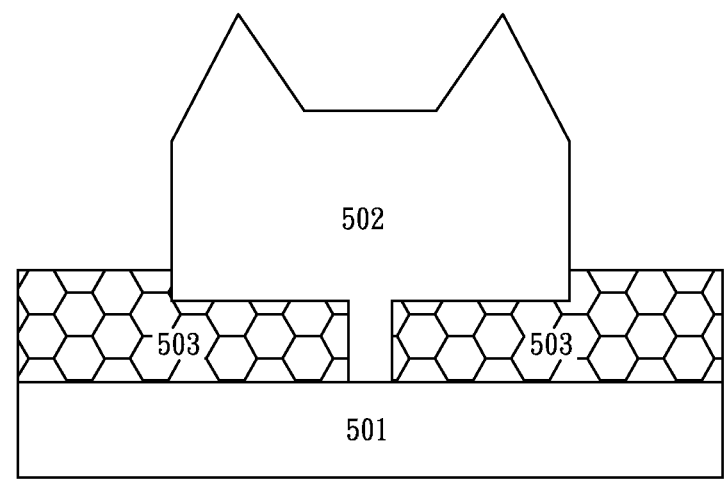
FIG. 5C is a schematic drawing of steps S502-S504 in the method for fabricating a mesa sidewall with a spin coated dielectric material according to the fifth embodiment of the present invention.

Step S504: Performing a first etching process. FIG. 5C is a schematic drawing of Steps S502-S504 in the method for fabricating a mesa sidewall with a spin coated dielectric material according to the fifth embodiment of the present invention. As seen in FIG. 5C, the spin coating process of Step S504 coats the liquid dielectric material to higher than the T-shape gate metal. After the drying process of Step S503 and another etching process, a small mesa of a dielectric material 503 is formed, as shown in FIG. 5C.

Figure 5D:
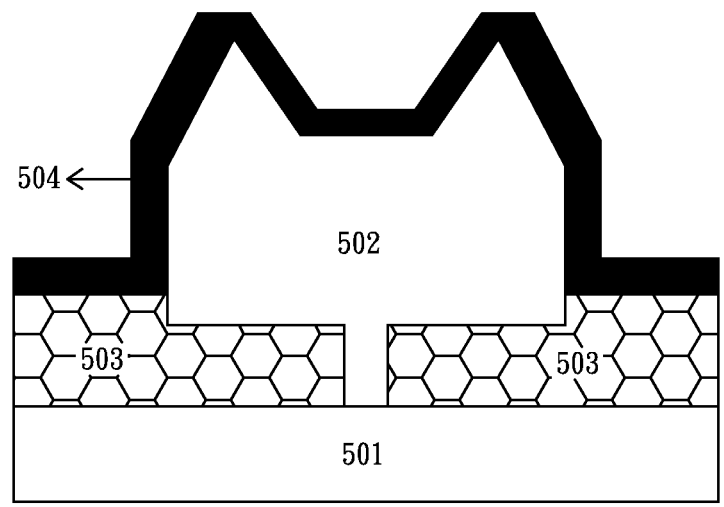
FIG. 5D is a schematic drawing of a step S505 in the method for fabricating a mesa sidewall with a spin coated dielectric material according to the fifth embodiment of the present invention.

Step S505: Performing a deposition process. FIG. 5D is a schematic drawing of Step S505 in the method for fabricating a mesa sidewall with a spin coated dielectric material according to the fifth embodiment of the present invention. As seen in FIG. 5D, the deposition technique may be PECVD, ICP-CVD, or ECR-CVD, employed to grow an insulation material 504 ($SiO^2$ or SiNx). Insulation material 504 thus grown will serve as an etching mask later.

Figure 5E:
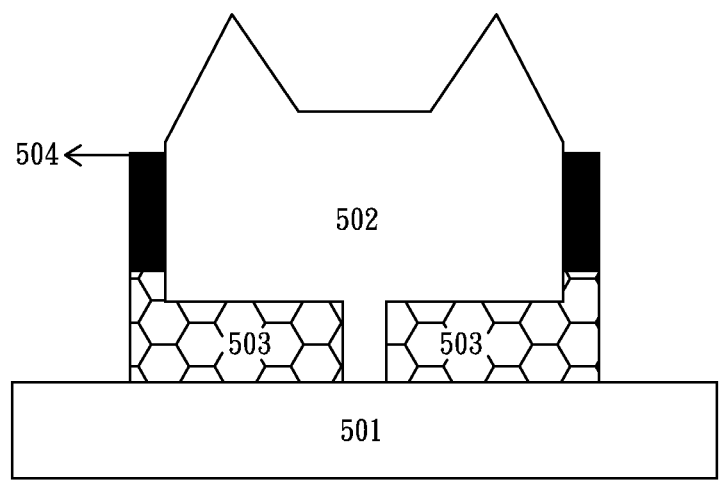
FIG. 5E is a schematic drawing of a step S506 in the method for fabricating a mesa sidewall with a spin coated dielectric material according to the fifth embodiment of the present invention.

Step S506: Performing a second etching process. FIG. 5E is a schematic drawing of Step S506 in the method for fabricating a mesa sidewall with a spin coated dielectric material according to the fifth embodiment of the present invention. As seen in FIG. 5E, since the thickness of insulation material 504 ($SiO^2$ or SiNx) on the sidewall is far larger than the thickness of the rest of insulation material 504, when performing the second etching process, the rest of the thin insulation material 504 and dielectric material 503 are removed.

Figure 5F:
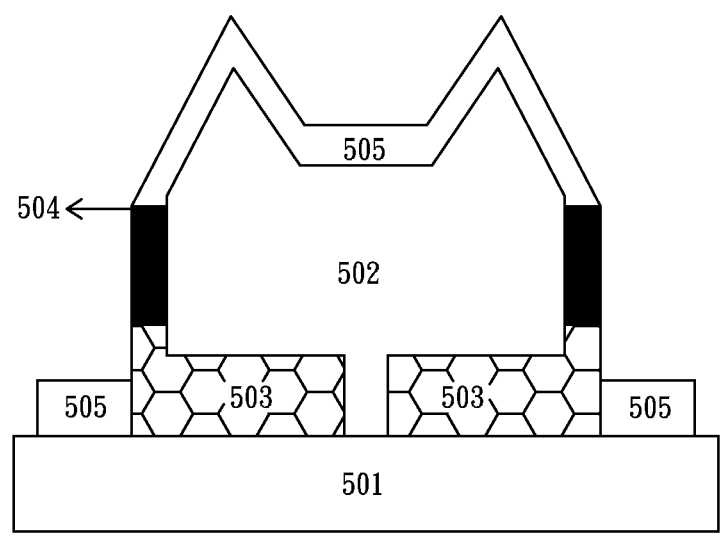
FIG. 5F is a schematic drawing of a step S507 in the method for fabricating a mesa sidewall with a spin coated dielectric material according to the fifth embodiment of the present invention.

Step S507: Performing a self-alignment process to form source/drain metals at the sides of the T-shape gate metal. FIG. 5F is a schematic drawing of Step S507 in the method for fabricating a mesa sidewall with a spin coated dielectric material according to the fifth embodiment of the present invention. As seen in FIG. 5F, a self-alignment process is performed to form source/drain metals at the two sides of the mesa sidewall. The self-alignment process may be a vapor deposition process.

People ordinarily skilled in the art can see that the element of FIG. 5F is an HEMT produced by a self-alignment process, and therefore source/drain metal 505 is still coated over T-shape gate metal 502. Theoretically, source/drain metal 505 coated over T-shape gate metal 502 and source/drain 505 at the sides should have the same thickness. FIG. 5F, being a schematic drawing, does not show source/drain metal 505 having the same thickness all along. However, people ordinarily skilled in the art should understand that during actual operation errors may occur, which in turn may cause uneven thicknesses in source/drain metal 505, and that the present invention is not limited to such a situation. Moreover, although a self-alignment process is performed in Step S507, people ordinarily skilled in the art can understand that a general mask process may also be employed, which does not form source/drain metal 505 over T-shape gate metal 502. The drawback of a mask process lies in high production cost. Therefore, the scope of the present invention is not limited to the specific situations of the fifth embodiment described herein.

From the first embodiment to the fifth embodiment as described above, it is known that the most significant characteristic in appearance of the element fabricated by the method of the present invention is that the sidewall of the semiconductor element is formed by a dielectric material, such as BCB, PI, or SOG.

In summary, the spirit of the present invention is to perform a spin coating process to coat a semiconductor sample with a liquid dielectric material, and to expose an upper metal part of the semiconductor element by an etching process, thereby forming an insulation oxide layer sidewall ($SiO^2$ or SiNx) or an extended protrusion. The insulation oxide layer sidewall or the extended protrusion then serves as an etching mask to anisotropically etch to remove the exposed liquid dielectric material so that a mesa sidewall made of a liquid dielectric material is formed. This fabrication process can substitute the deposition process in the conventional art to avoid unnecessary damage to the element and thereby enhance the mechanical strength thereof.

While certain exemplary embodiments have been described and shown in the accompanying drawings, it is to be understood that such embodiments are merely illustrative of and not restrictive on the broad invention, and that this invention should not be limited to the specific construction and arrangement shown and described, since various other modifications may occur to those ordinarily skilled in the art. It will be apparent that various changes and modifications can be made without departing from the spirit and scope of the invention as defined in the appended claims.

What is claimed is:

1. A method for fabricating a mesa sidewall with a spin coated dielectric material, comprising:
   disposing an object having a wide-top-narrow-bottom structure on a semiconductor substrate;
   performing a spin coating process to coat with a liquid dielectric material;
   performing a drying process to render the liquid dielectric material a dried dielectric material;
   performing an etching process to form a semiconductor element with a mesa sidewall, wherein the object is a heterojunction bipolar transistor (HBT) and comprises:
   the semiconductor substrate, comprising a stress buffer layer, sub-collector and a collector;
   a base mesa, disposed over the semiconductor substrate;
   an emitter mesa, disposed over the base mesa;
   an emitter metal, disposed over the emitter mesa, wherein a width of the emitter metal is larger than a width of the emitter mesa;
   a base metal, disposed over the base mesa and at one side of the emitter mesa, wherein a thickness of the base metal is smaller than a thickness of the emitter mesa and a first predetermined fixed distance exists between the base metal and the emitter mesa.

2. The method according to claim 1, wherein performing a spin coating process comprises coating a semiconductor sample with the liquid dielectric material so that the liquid dielectric material fills gaps between the emitter mesa and the base metal.

3. The method according to claim 1, after performing an etching process further comprising:
performing a deposition process to insulate a structure unaffected by ion bombardment of the object;
performing a second etching process to remove the insulation by the deposition process and excessive said dried dielectric material; and
performing a third etching process to remove the base mesa outside the base metal.

4. The method according to claim 1, wherein the semiconductor substrate comprises a silicon substrate, an InP substrate, or a GaAs substrate.

5. A method for fabricating a mesa sidewall with a spin coated dielectric material, comprising:
disposing an object having a wide-top-narrow-bottom structure on a semiconductor substrate;
performing a spin coating process to coat with a liquid dielectric material;
performing a drying process to render the liquid dielectric material a dried dielectric material;
performing an etching process to form a semiconductor element with a mesa sidewall wherein the object is a high electron mobility transistor (HEMT) and comprises a T-shape gate metal, disposed on the semiconductor substrate and having a wide-top-narrow-bottom structure, comprising a head metal and a foot metal, wherein performing an etching process further comprises:
performing a deposition process to insulate a structure unaffected by ion bombardment part of the object;
performing a second etching process to remove the insulation by the deposition process and excessive said dried dielectric material; and
performing a self-aligned process to form a source metal and a drain metal beside the T-shape gate metal.

6. The method according to claim 5, wherein performing a spin coating process comprises coating a semiconductor sample with the liquid dielectric material so that the liquid dielectric material fills gaps between the emitter mesa and the base metal.

* * * * *